(12) United States Patent
Gonzalez et al.

(10) Patent No.: US 6,178,113 B1
(45) Date of Patent: *Jan. 23, 2001

(54) DUAL FLOATING GATE PROGRAMMABLE READ ONLY MEMORY CELL STRUCTURE AND METHOD FOR ITS FABRICATION AND OPERATION

(75) Inventors: Fernando Gonzalez, Boise, ID (US); Francis L. Bensistant, Freemont, CA (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/132,667

(22) Filed: Aug. 12, 1998

Related U.S. Application Data

(63) Continuation of application No. 09/056,764, filed on Apr. 8, 1998.

(51) Int. Cl.[7] .......................... G11C 16/04; H01L 29/788
(52) U.S. Cl. ................................. 365/185.03; 365/185.1; 257/316; 257/319
(58) Field of Search .......................... 365/185.03, 185.1, 365/185.19, 185.24; 257/315, 316, 219

(56) References Cited

U.S. PATENT DOCUMENTS

| 4,380,057 | * | 4/1983 | Kotecha et al. | 365/185 |
| 5,021,999 | * | 6/1991 | Kohda et al. | 365/185 |
| 5,674,768 | * | 10/1997 | Chang et al. | 437/43 |
| 5,841,693 | * | 11/1998 | Tsukiji | 365/185.01 |
| 5,877,523 | * | 3/1999 | Liang et al. | 365/185.26 |

* cited by examiner

*Primary Examiner*—Son Mai
(74) *Attorney, Agent, or Firm*—Dickstein Shapiro Morin & Oshinsky LLP

(57) ABSTRACT

A flash memory cell in the form of a transistor capable of storing multi-bit binary data is disclosed. A pair of floating gates are provided beneath a control gate. The control gate is connected to a word line while active doped regions (source and drain regions) are connected to respective digit lines. The floating gates are separately charged and read out by controlling voltages applied to the word line and digit lines. The read out charges are decoded into a multi-bit binary value. One or both of the floating gates has a side insulator which connects through a conductor to an associated active doped region thereby forming a capacitor across the side insulator between the floating gate. This capacitor and active region facilitates operation of the transistor as a flash memory cell. Methods of fabricating the memory cell and operating it are also disclosed.

52 Claims, 17 Drawing Sheets

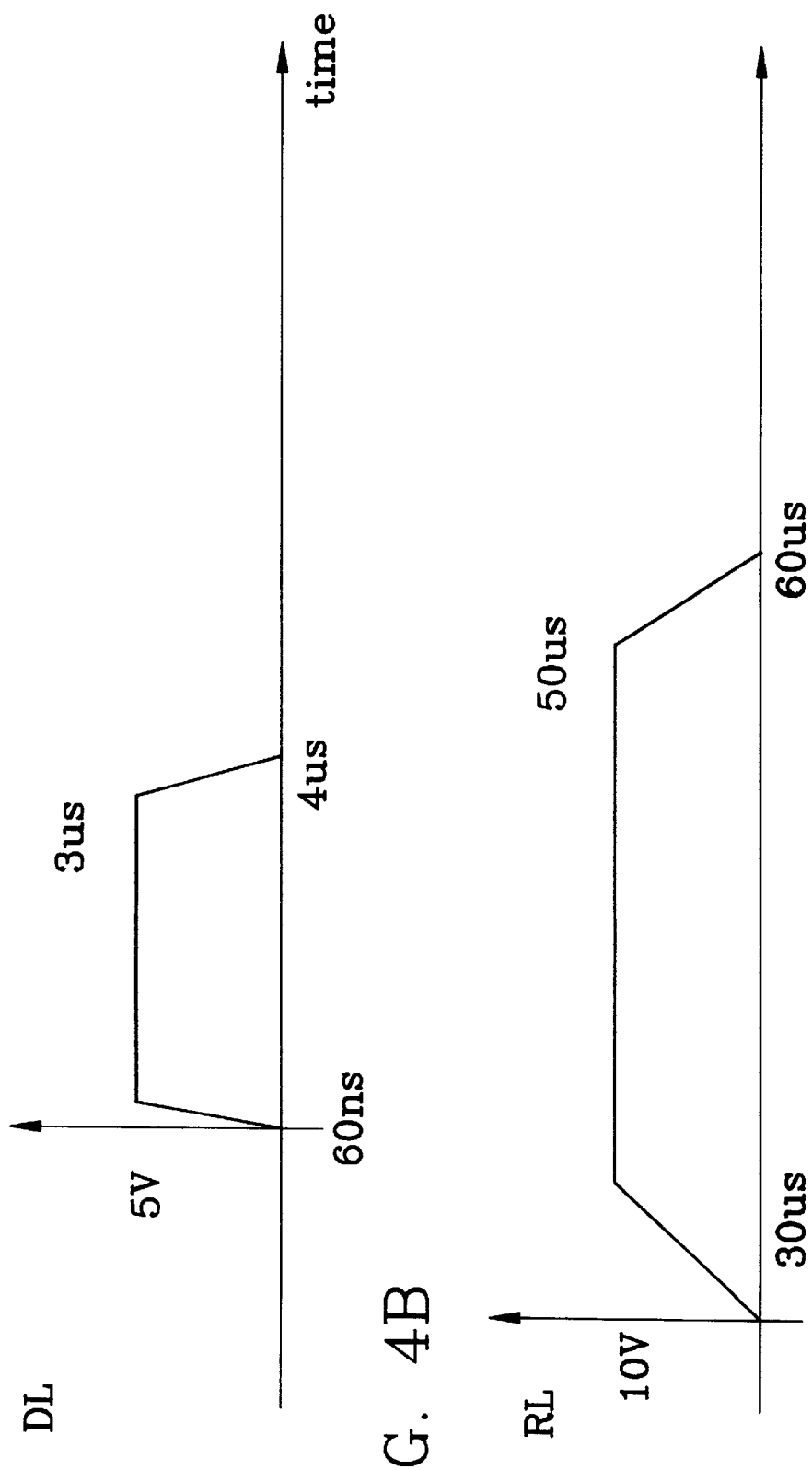

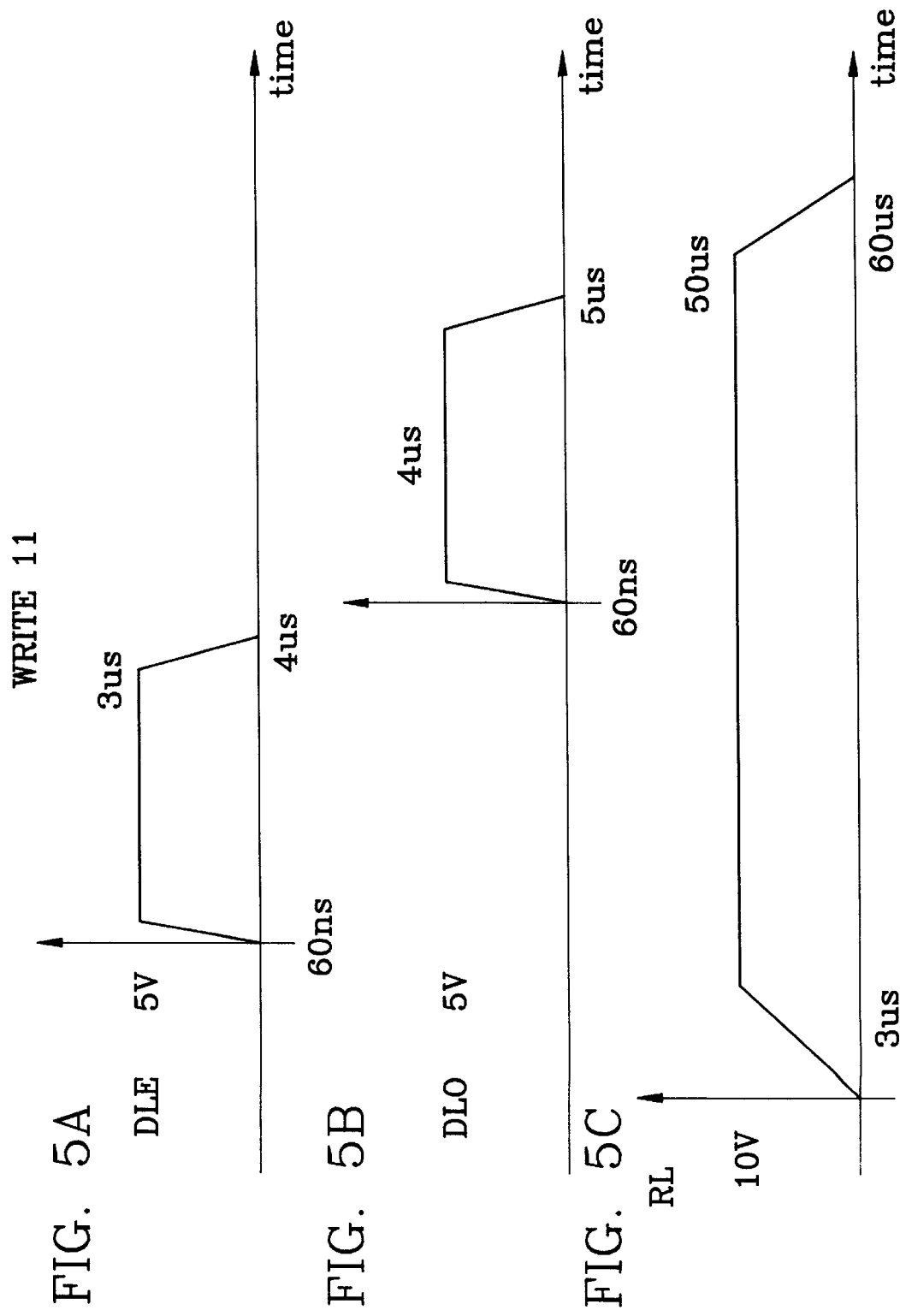

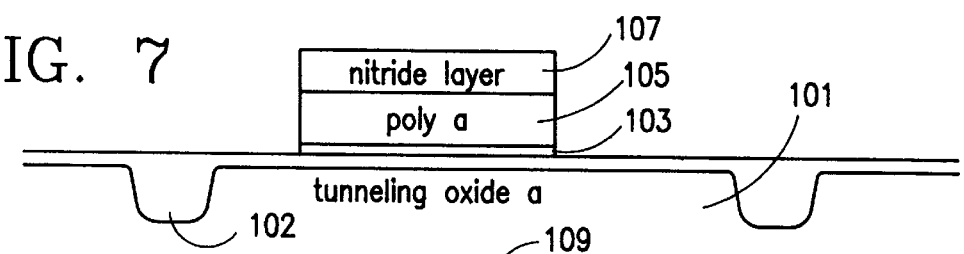
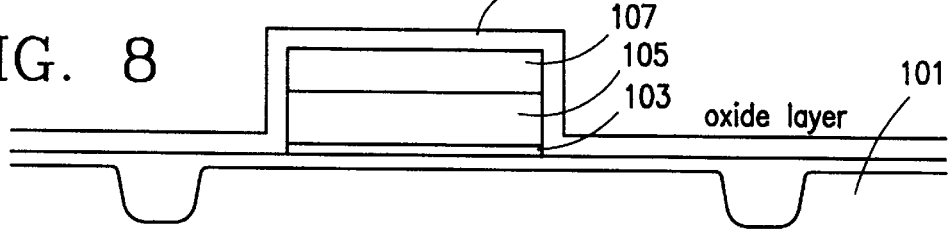
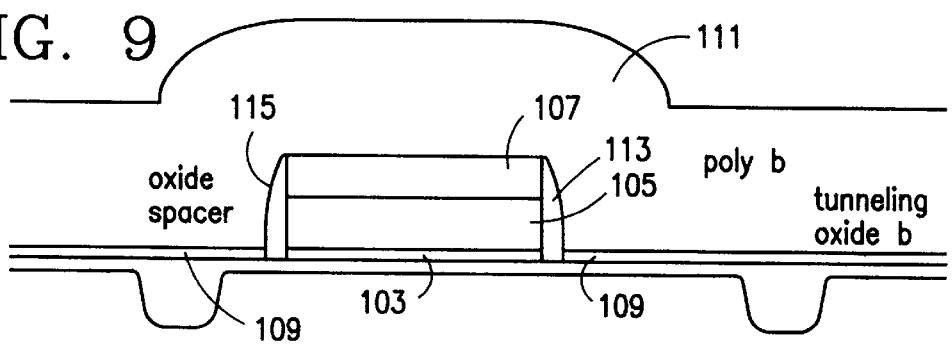
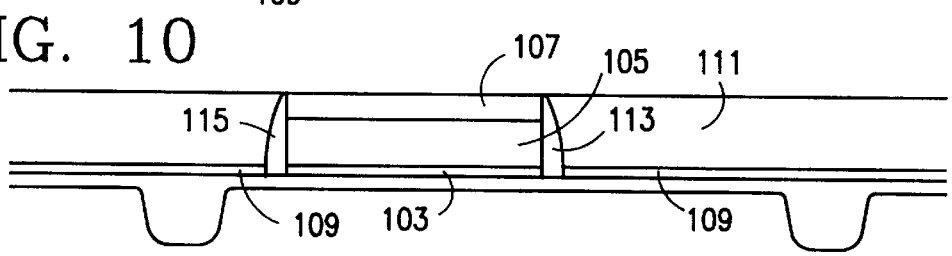
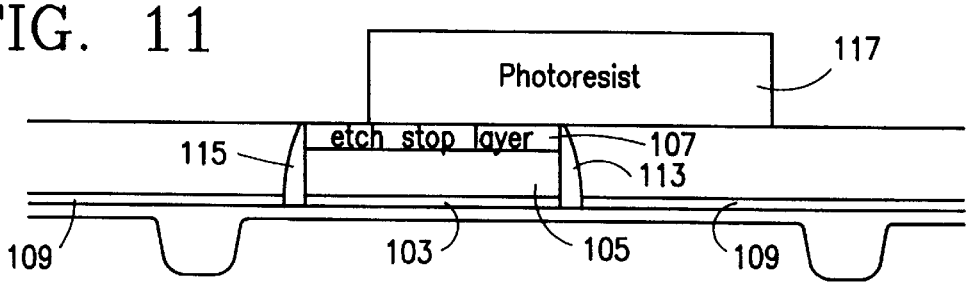
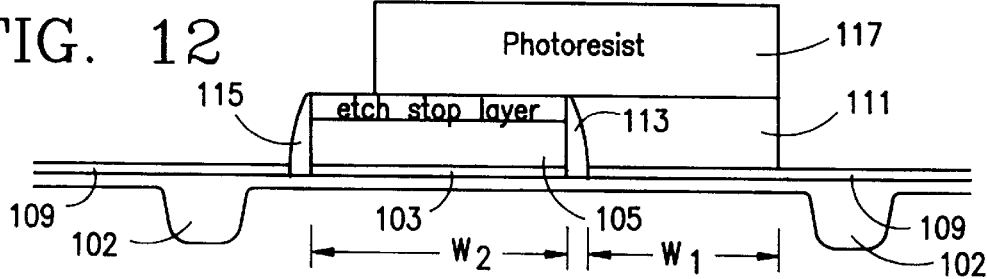

DUAL FLOATING GATE PROGRAMMABLE READ ONLY MEMORY CELL STRUCTURE AND METHOD FOR ITS FABRICATION AND OPERATION

DISCUSSION OF RELATED APPLICATION

This application is a continuation of U.S. application Ser. No. 09/056,764, filed Apr. 8, 1998, the disclosure of which is incorporated herein by reference.

BACKGROUND OF THE INVENTION

1. Field of the Invention

The present invention relates to a unique cell structure for a non-volatile memory used in erasable programmable, read only memory devices such as EEPROM and flash memory. More particularly the invention relates to a cell structure having a transistor which employs a pair of floating gates to store multi-bit binary data and to methods for fabricating and operating the memory cell.

2. Discussion of the Related Art

Nonvolatile memory cells are known in which multiple bits of data can be stored by placing various levels of charge on the floating gate of the cell transistor which in turn affects the transistor threshold voltage Vt. By storing differing levels of charge and thus obtaining different levels of threshold voltage Vt a cell can store more than one bit of information therein. For example, in order to store two binary bits four levels of charge and correspondingly levels of Vt may be used. During a read operation, a decoder senses the transistor threshold Vt to determine the corresponding binary value of the multi-bit information, e.g. 00, 01, 10, 11.

In order to store higher densities of binary bits in the cell, it is necessary to correspondingly increase the number of Vt voltage levels corresponding to the number of bits of information which are stored. For example, in order to store three bits, eight levels of charge must be stored. As higher voltages are used, for charge storage, it introduces problems in the memory array including requiring a higher operating voltage, more power dissipation, and complex circuitry for reading, erasing and decoding the binary information. Moreover, if the number of charge levels increases without increasing the supply voltage, it becomes more difficult to detect the correct stored charge level. Accordingly, it becomes progressively more difficult to store larger numbers of digits of information in an erasable programmable memory cell having a floating gate.

SUMMARY OF THE INVENTION

The present invention is designed to alleviate some of the problems associated with the storage of multi-bit binary information in the memory cell of an erasable programmable read only memory array. The present invention provides two separate floating gates for each transistor within the memory cell. The control gate of the transistor is connected to a word line provided over both floating gates while each of the source and drain regions of the transistor are connected to respective digit lines. By appropriately controlling the voltage differential applied to the word line and digit lines and timing of application of the voltage differential, separate charges can be stored and read from each of the two floating gates of the transistor. By utilizing two separate floating gates to respectively store charges within the transistor, the reading, writing, erasing and decoding of the multi-bit information can be done with lower voltages and power dissipation than would otherwise be required for a single floating gate transistor and the decoding of many levels of stored charges is not required. Therefore, repeated storage of multi-bit data does not degrade the cell as much as occurs with a single floating gate transistor cell.

Thus, the memory cell of the invention can be used to store two or more bits of information by separately controlling the charges stored in each of the floating gates.

The invention also relates to fabrication methods for the dual floating gate transistor as well as to a method for operating the transistor to write and read multi-bit digital data to and from the memory cell. One of the fabrication methods provides for a transistor structure which has an extended area of overlap with each of the floating gates and a respective substrate active region (source/drain region), with a dielectric between them, which gives a greater degree of flexibility in programming and operating the transistor as a storage device.

It should be understood that the memory cell of the invention can be used in EEPROM, flash memory arrays, and other erasable programmable read only memory arrays. For purposes of simplified discussion, this specification will discuss the invention in the context of a flash memory array; however, it should be understood that the memory cell of the invention can be used in any read only memory array which is electronically erasable and reprogrammable.

The foregoing and other advantages and features of the invention will be more readily appreciated from the following detailed description of the invention which is provided in connection with the accompanying drawings.

BRIEF DESCRIPTION OF THE DRAWINGS

FIGS. 4A and 4B represent timing diagrams for activating the digit lines and row line to write binary data "01" or "10" into a memory cell;

FIGS. 5A, 5B, and 5C illustrate the timing diagrams for activating the digit lines and row line to write binary data "11" into the memory cell;

FIGS. 7 through 18 illustrate the steps for constructing a memory cell in accordance with a first fabrication embodiment of the invention;

DETAILED DESCRIPTION OF THE INVENTION

Figure 1:
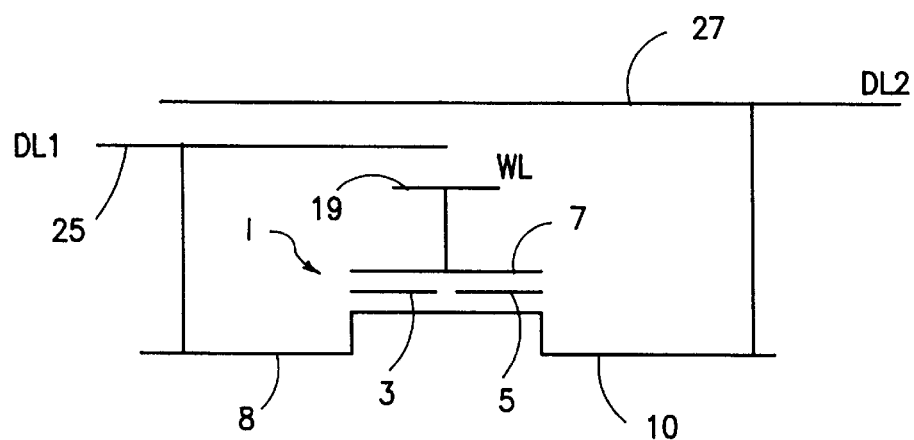
FIG. 1 illustrates the electrical schematic of a memory cell constructed in accordance with the invention.

FIG. 1 illustrates a memory cell constructed in accordance with the teachings of the invention. The memory cell is formed of a MOSFET transistor 1 having respective source and drain regions 8 and 10, a pair of floating gates 3 and 5, and a control gate 7 provided over both floating gates 3 and 5. The source 8 is respectively connected to a first digit line 25, and the drain 10 is respectively connected to a second digit line 27. The control gate 7 is connected to a row (word) line 19.

Figure 2:
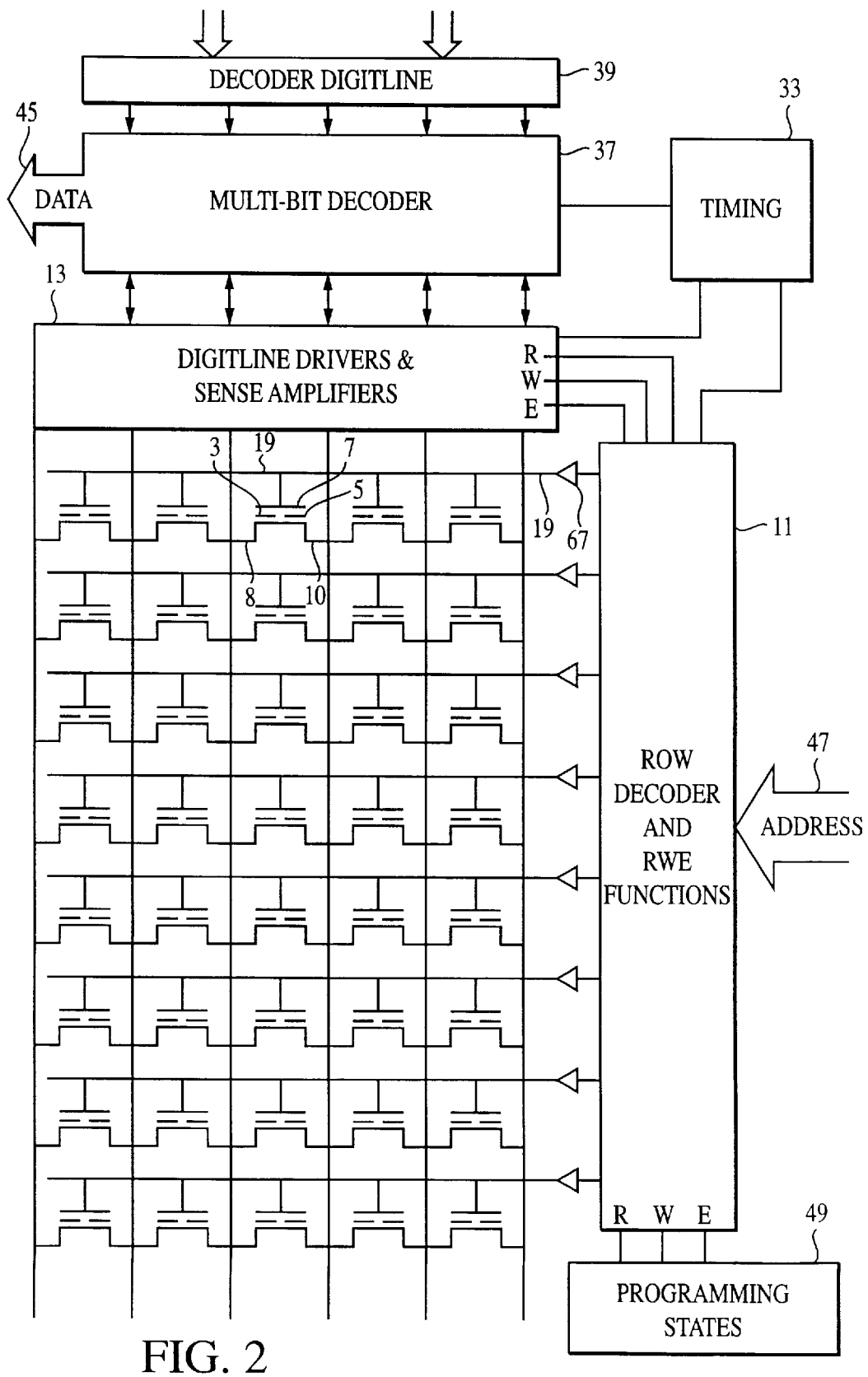
FIG. 2 illustrates an electrical schematic of an array of memory cells arranged in accordance with the invention.
Figure 3:
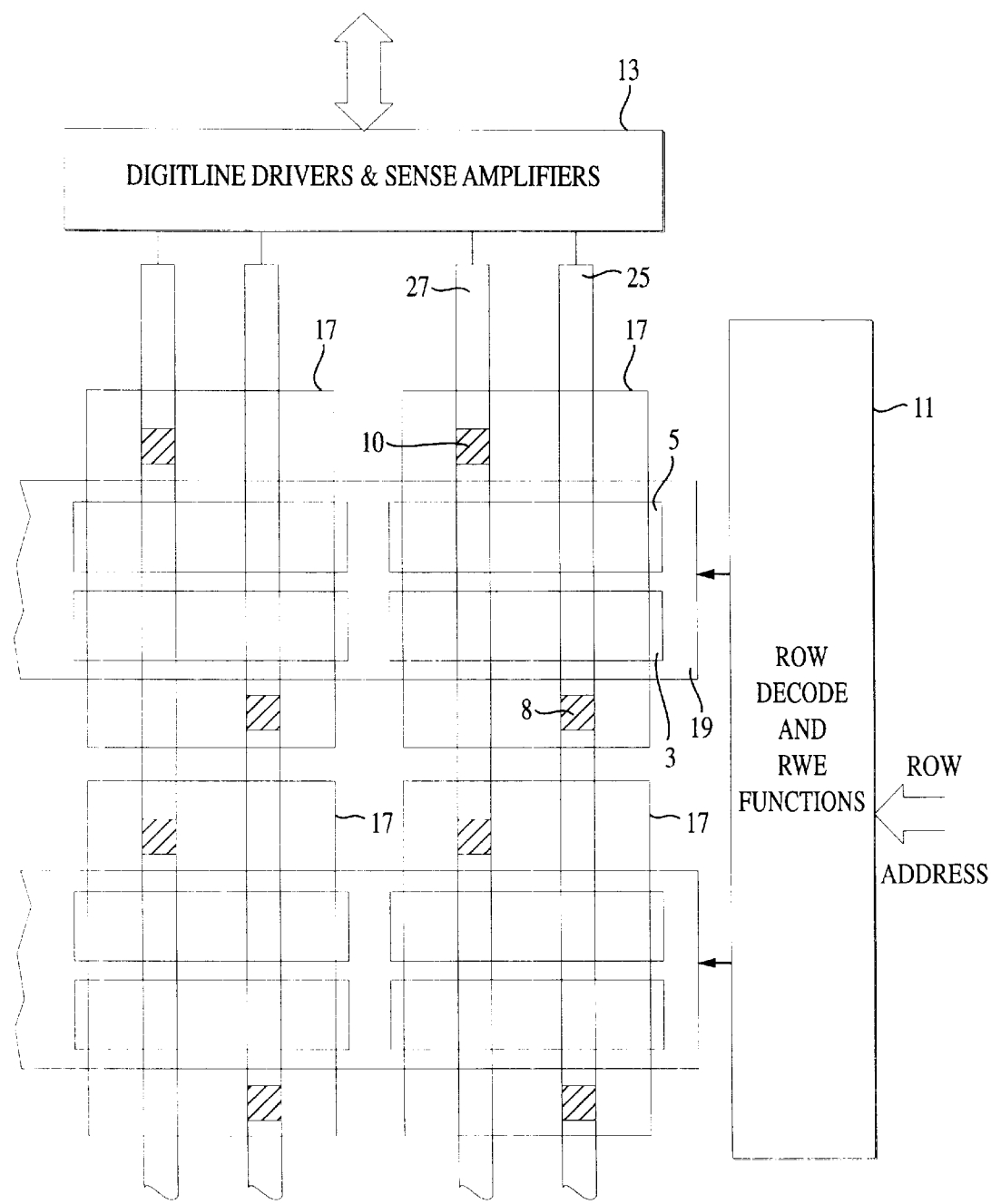
FIG. 3 illustrates a top view of the topology of the memory cell constructed in accordance with the invention.

The manner in which the transistor shown in FIG. 1 is integrated into a memory array is illustrated in FIGS. 2 and 3, where FIG. 2 illustrates the electrical connection of the FIG. 1 transistor into a memory array and FIG. 3 illustrates in schematic form a top view of portion of a silicon substrate containing a portion of the memory array.

FIG. 3 shows a memory cell 17 which contains the transistor 1 structure shown in FIG. 1. Row line 19 extends over respective floating gate regions 3 and 5. Digit lines 25 and 27, which are perpendicular to row line 19, are also illustrated as respectively extending over, and connecting with, source and drain regions 8 and 10. Each transistor is thus controlled by voltages applied to the row line 19 which covers both floating gates 3 and 5 and the respective digit lines 25 and 27 electrically connected to source and drain regions 8 and 10.

It should be noted that although the above description references region 8 as a source and region 10 as a drain, in fact, during the programming and readout operations, transistor 1 is operated so that each of regions 8 and 10 operate at one time or another as a source or a drain. Accordingly, for purposes of further discussion it should be recognized that whenever a region is identified as source or a drain region, it is only for convenience and that in fact during operation of the transistor either region 8 or 10 could be a source or a drain depending on the manner in which the transistor is being controlled by voltages applied to the row line 19 and digit line 25 and 27 conductors.

FIG. 3 further illustrates in block diagram format a circuit 11 labeled row decode and read, write, erase (RWE) functions. Circuit 11 forms part of an electric circuit which supplies the necessary voltage control signals to the row conductor 19 during execution of a read, write or erase operation. The row conductor 19 cooperates with digit lines 25 and 27, which are in turn activated by a digit line driver and sense amplifiers circuit 13 which is also part of an electric circuit for supplying the necessary voltage control signals to the digit lines 25, 27 during execution of a read, write or erase operation. Circuit 13 is connected to a timing block 33 which is run off a clock 25, as shown in FIG. 2.

The electrical schematic connection of a memory array using the FIG. 1 memory cell is illustrated in greater detail in FIG. 2 which shows a portion of a memory array. There, each transistor in the array is shown in greater detail as is the connection to the row decoder and RWE circuit 11, the timing block 33, the clock 35 the odd (O) and even (E) digit lines 25, 27 and the digitline drivers and sense amplifiers circuit 13. Circuit 13 is in turn connected to a multi-bit decoder circuit 37. The function of decoder 37 is to decode the voltages which are sensed by the sense amplifiers on the odd and even digit lines 25 and 27 when a particular memory cell is read to thereby decode the value of the multi-bit information stored within the memory cell. The decoded multi-bit binary value, e.g. 00, 01, 10, 11 for a two-bit cell, is supplied out of the decoder block 37 as read data 45. The multi-bit decoder circuit 37 is also connected to a digit line decoder circuit 39 which decodes digit line addresses 42 for reading and writing information from and to a particular memory cell transistor 1. Digit line decoder circuit 39 also has a data input 41 which is used to program data into the memory cell transistor 1 as will be described in detail below. The row decoder also contains a row address input 47 as well as an RWE input from a programming state device 49 i.e. a memory controller, which determines which of the read, write and erase memory operations is to be performed so that both the row decoder and RWE circuit 11 and digitline drivers and sense amplifiers circuit 13 are appropriately operated to execute either a read, write or erase operation. The row decoder and RWE function circuit 11 is shown as connected to row lines 19 through respective driver amplifiers 67.

As noted earlier, the present invention utilizes a pair of floating gates 3 and 5 in each memory cell transistor to store charges representing the multi-bit binary data which is stored in each memory cell. For ease of subsequent discussion, we will assume for the moment that two binary bits of information are to be stored in each memory cell, i.e., one of the four states 00, 01, 10, and 11. In the following discussion, all the voltages and timing signals similar to the voltages and timing signals typically used in operation of a single floating gate transistor. Thus, the dual floating gate cell of the invention is able to easily store multi-bit binary data in a cell which operates in a manner which is similar to a conventional flash memory cell.

The programming of a memory cell to write a 01 or 10 state is illustrated in FIGS. 4A and 4B. The signal relationship is shown when FIGS. 4A and 4b are considered together. FIG. 4A represents the timing of a voltage which is applied to one of the digit lines (odd or even) by the digitline drivers and sense amplifiers circuit 13 depending on whether the incoming data 41 is to be stored as a 01 or 10 condition. As shown in FIG. 4A, a pulse having a duration in the range of 2 to 10 microseconds, and preferably of approximately 4 microseconds (us) duration, and at a level of approximately 5 volts, is applied to digit line (again either odd or even depending on whether the programmed condition is 01 or 10) while at the same time, row line 19 has a pulse applied thereto of approximately 10 volts for a period in the range of 20–100 microseconds and preferably of approximately 60 microseconds (us). As shown in FIGS. 4A and 4B, the row voltage is applied first, followed by the digit line voltage approximately 60 nanoseconds (ns) later. The overlapping voltages applied to the row line and digit line, creates a voltage differential across a floating gate to which the digit line corresponds causing the floating gate to store a charge.

FIGS. 5A, 5B and 5C, illustrate the timing diagrams for writing a 11 state into a memory cell transistor 1. As shown in FIG. 5A, the even digit line e.g. digit line 27, has a pulse in the range of 2 to 10 microseconds and preferably of approximately 3 microseconds (us) applied thereto, while at the same time the row line has approximately 10 volts applied thereto. The digit line 27 pulse occurs after the beginning of the row line pulse. This charges the floating gate associated with even digit line 27. After the digit line 27 is deactivated for approximately 60 ns, then the odd digit line 25 is activated for 2 to 10 microseconds and preferably for approximately 5 microseconds (us). During this period the row line 19 remains active throughout a period in the range of 20 to 100 microseconds and preferably for approximately, 60 microseconds (us). In this manner, both digit lines are activated in sequence while the row line is activated to cause the differential voltage between the row line and each digit line to store a charge in each of the floating gate regions 3 and 5.

Figure 6A:
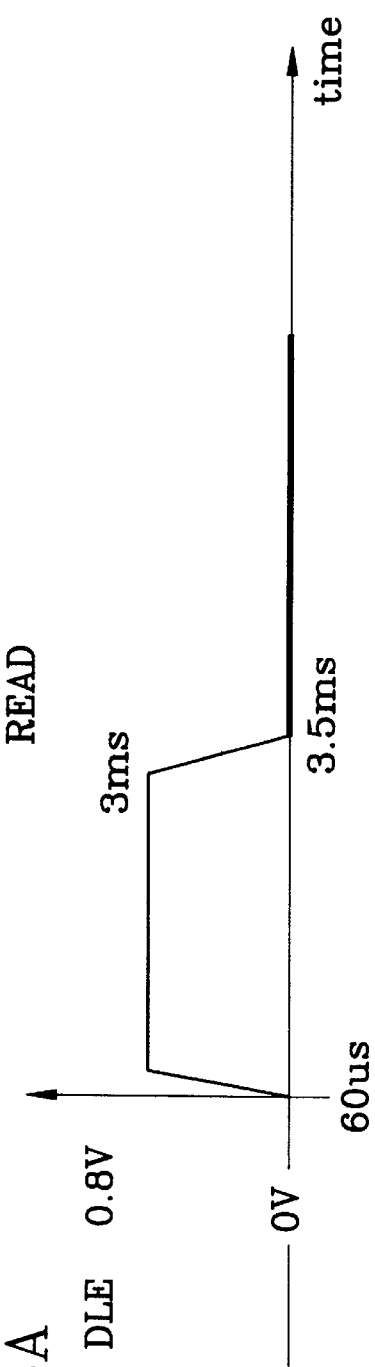
FIGS. 6A, 6B and 6C illustrate timing diagrams for activating the digit lines and row line to read a stored multi-bit binary value from the memory cell.
Figure 6B:
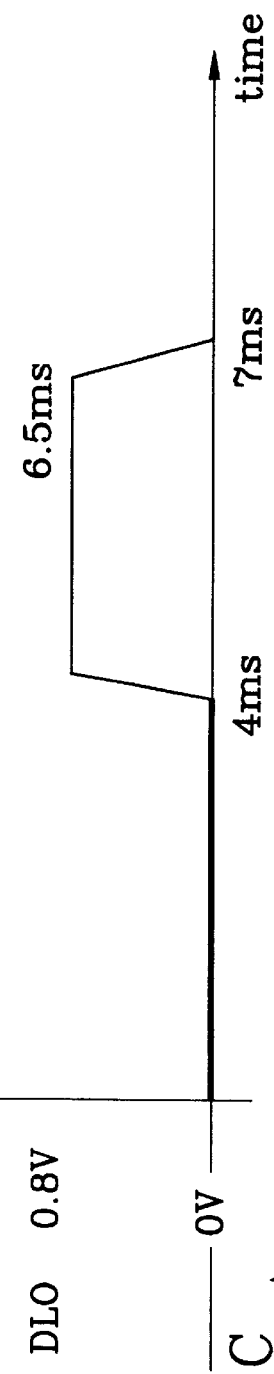
Figure 6C:
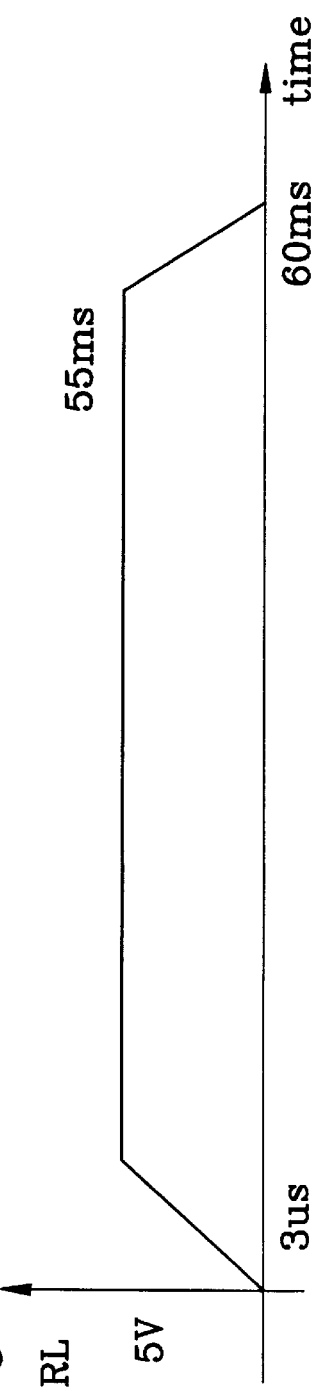

The manner in which stored charges can be read out from the transistor 1 is illustrated in FIGS. 6A, 6B and 6C. During a read operation, each of the digit lines is again activated, but this time, at a much lower voltage. As shown in FIGS. 6A and 6B, the digit lines have approximately 0.8 volt applied thereto. Again, this voltage is applied in sequence so that first the even digit line 27 has the voltage applied for a period in the range of 2 to 10 milliseconds (ms) and preferably for approximately 3.5 milliseconds, following which, the odd digit line 25 has the same voltage applied a period in the range of 2 to 10 milliseconds and preferably for approximately 3.5 milliseconds, so that in total, approximately 7 milliseconds are required for a read operation. During the entire time that the even and odd digit lines 27 and 25 are sequentially activated, the row line is activated with a higher voltage of approximately 5 volts for a period in the range of 20–100 milliseconds and for preferably approximately 60 milliseconds creating a differential voltage across the corresponding floating gates. This differential voltage between the row line 19 and each of the respective digit lines 25, 27 causes a read Out through the sense amplifiers within the digitline drivers and sense amplifiers circuit 13 (FIG. 2) of a voltage value corresponding to the respective charges stored in each of the two floating gates 3 and 5 for each transistor 1. The output voltages from the respective even and odd digit lines are applied to the decoder 37 illustrated in FIG. 2, from the sense amplifiers. Decoder 37 takes the two voltages from the odd and even digit lines (25 and 27) and determines which of the states 00, 01, 10, or 11 was previously stored in the transistor 1. This data is then output via bus 45 from the decoder 37.

Each memory cell which is selected for either a write or read of data is addressed by the row decoder 11 and digit line decoder 39 in a conventional fashion. Accordingly, a detailed discussion of how row and digit address decoders operate will not be provided herein. Suffice it to say that when a digit line is addressed there are two digit lines (odd and even) which are activated in sequence for a read operation and for writing the 11 state, while one or the other of the digit lines is activated for writing a 01 or 10 value into the memory cell.

Data is erased from transistor 1 by applying differential voltages across the row and digit lines in a manner which causes the charges stored within the floating gates to either tunnel to the digitlines, or tunnel to the substrate. This restores the cell to a 00 state. In the case of the former, a voltage differential is applied by setting the row voltage to approximately zero volts while the digit lines are set at approximately 10 volts. By doing this, the electrons which are stored at the floating gate are attracted and tunnel to the digit line positive potential. Also, during the erase cycle, the digit lines alternate so that first the even 27 and then the odd 25 (or vice-versa) digit lines have the approximately 10 volts applied to them, while the row conductor remains at approximately zero volts. It is also possible to set the digit lines at a lower voltage, for example, 6 volts, while the word line has approximately 4 volts applied to it. The differential voltage across the floating gate regions is still approximately 10 volts as before and erasure of the floating gate region charges will occur.

An alternative way to erase the memory cells is to have the electrons tunnel to the substrate from the two floating gates 3, 5. For this to occur, the erase can be accomplished by applying approximately 10 volts to the substrate while the word line is set at approximately zero volts.

Although representative voltages and timing patterns have been described for writing, reading and erasing a memory cell of the invention, these are merely exemplary. Many changes and modifications can be made to produce, write, read and erase signals which are equivalent to those described above and which can be used in an equivalent manner to operate the memory cell transistor 1 in the write, read and erase modes.

The manner of fabricating transistor 1 having floating gates 3 and 5 will now be described with reference to FIGS. 7–24 and 27–44. A first fabrication embodiment is described with reference FIGS. 7–18, a second fabrication embodiment is described with respect to FIGS. 19–24, and a third fabrication embodiment is described with reference to FIGS. 27–44.

FIG. 7 illustrates a P-type silicon substrate 101 which has a field oxide region 102 which surrounds isolates and defines the boundary of an active area (e.g. area 17 in FIG. 3) in which transistor 1 will be fabricated. FIG. 7 also illustrates that an oxide layer 103 e.g. silicon dioxide, has been applied and on top of that, a first doped polysilicon layer 105 has been deposited. Over this, another deposited layer in the form of silicon nitride is applied. It should be understood that those skilled in the art readily understand the deposition, masking and etching steps needed to construct the structure illustrated in FIG. 7.

FIG. 8 illustrates subsequent processing steps. In FIG. 8 an additional oxide layer 109, e.g. silicon dioxide, is applied over the entire surface of the silicon substrate 101. The oxide layer 109 over the nitride layer 107 is removed by an RIE etch to form oxide spacers 113, 115. The RIE etch of the oxide layer 109 leaves oxide spacer regions 113 and 115 on either side of the polysilicon region 105 and silicon nitride layer 107. Afterwards, as shown in FIG. 9 another doped polysilicon layer 111 is applied over the entire surface of the substrate 101. The polysilicon layer 111 is then partially removed by planarization to produce the structure illustrated in FIG. 10. As shown, the nitride layer 107 is somewhat reduced in thickness, but the polysilicon layer 105 is still intact, as are the spacer regions 113 and 115.

Figure 13:
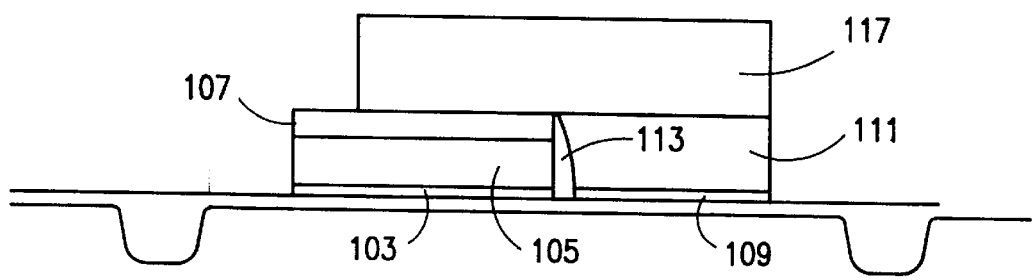
Figure 14:
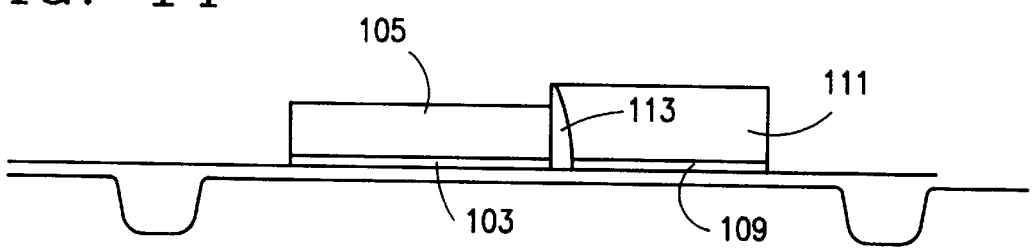

Following this, as illustrated in FIG. 11, a photoresist 117 is applied for the purposes of etching the remaining polysilicon layer 111. The photoresist layer 117 as well as the nitride layer 107 and oxide spacer 115 serve as a mask for the etching process so that, as shown in FIG. 12, once etched, the polysilicon layer 111 remains only in the region to the right of spacer 113 and below the photoresist layer 117. The width "$W_1$" of area 111 may be larger than or smaller than the width "$W_2$" of area 105 in the direction of the length of the transistor between the field oxide region 102, as shown in FIG. 12. In the next step the oxide spacer 115 and remaining portion of oxide layer 109 are removed, as illustrated in FIG. 13, by etching. In the next step, the photoresist layer 117 is removed as is the nitride layer 107 which was present over the polysilicon layer 105, leaving the structure illustrated in FIG. 14. FIG. 14 now shows two adjacent polysilicon layers, 105 and 111, separated by an oxide spacer 113. These will become the floating gate regions 3 and 5 of transistor 1.

Figure 15:
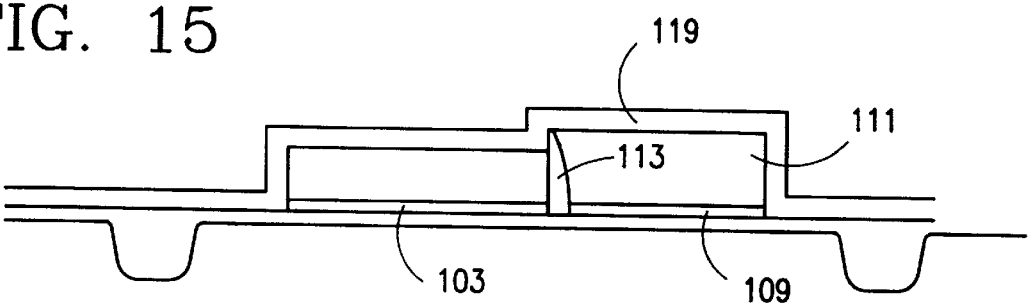
Figure 16:
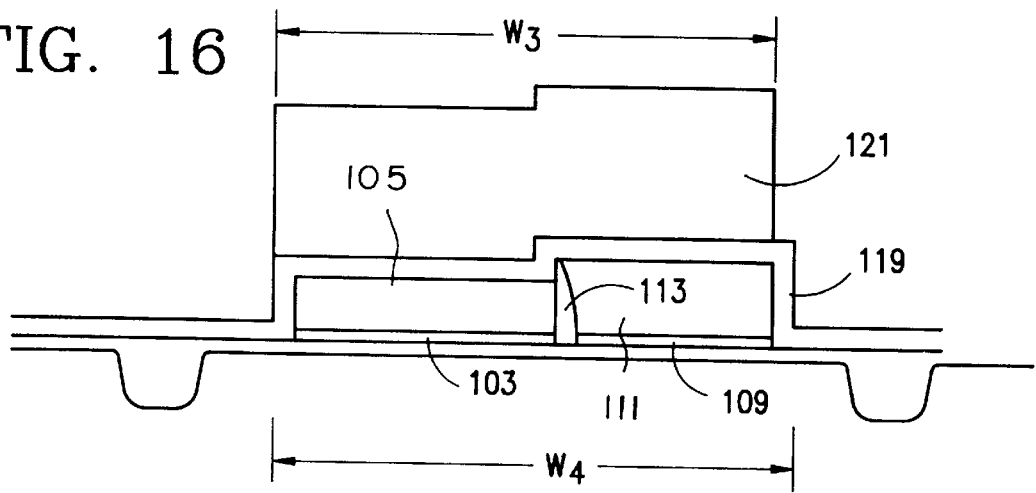
Figure 17:
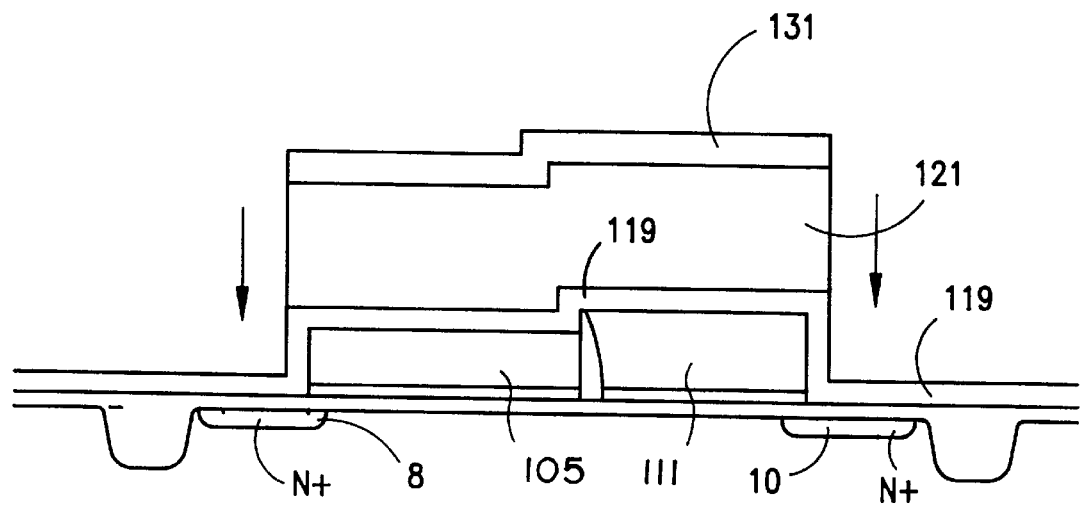

FIG. 15 illustrates the structure of FIG. 14 after an ONO (oxide, nitride, oxide) layer 119 is applied over the substrate. Following this, as shown in FIG. 16, a doped polysilicon word line 121 is deposited which also serves as the control gate for the transistor 1. The width "$W_3$" of word line 121 is less than or equal to the width "$W_4$" of the combined structure formed by layers 105, 111, 113 and 119. Following this, as shown in FIG. 17, a polysilicide layer 131, is applied, which also serves as a mask to remove the ONO layer 119 from those portions of the substrate not covered by the polysilicide layer 131. Although FIG. 17 shows polysilicide layer 131 over layer 121 extending as wide as the polysilicon floating gate layers 105, 111, in practice the polysilicide layer 131 over layer 121 may not extend over the full width of the polysilicon floating gate regions 105, 111.

Figure 18:
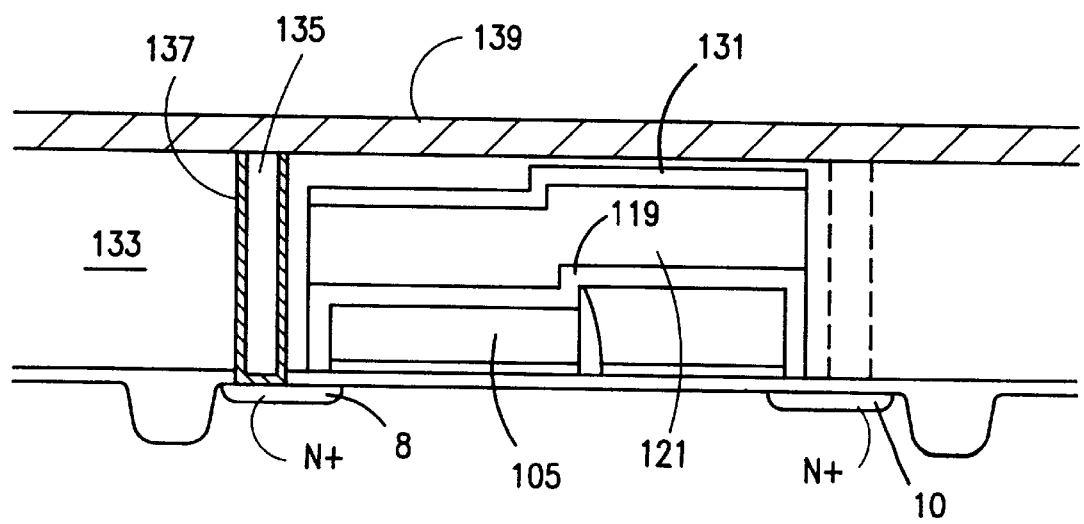

Subsequent to removal of the exposed ONO layer 119, a diffusion process is employed to diffuse N+ regions into the substrate which will form the source 8 and drain 10 of the transistor 1. Then, the entire surface of the substrate is covered with a BPSG layer 133. This layer is then subjected to a high temperature process to activate the dopant in the channels and to cause the BPSG to soften and flow into small crevices in the integrated circuit. A plug 135 is then etched in the BPSG layer 133 down to the surface of the substrate 101 above source region 8, as shown in FIG. 18. FIG. 18 also shows in dotted line form an additional plug formed over drain region 10 at a different cross-sectional location in the substrate. See, for example, FIG. 3 showing the source 8 and drain 10 regions. FIG. 18 also illustrates plug 135 as containing a conductive wall 137 which extends from a conductive layer 139 applied only the BPSG layer 133 down to source region 8. The conducting layer 139 serves as digit line 25 connecting to the source region 8 through the conductive side wall 137 of the plug 135. Likewise, the other digit line 27, not shown in FIG. 18, connects through the dotted line plug in FIG. 18 to the drain region 10. The conductive layer 139 may be formed as a Ti liner which is covered by a Ti N barrier with the plug 135 then being filled with a $WSi_x$ fill.

Subsequently, conventional processing steps are applied to the integrated circuit of FIG. 18 to form the metal interconnect patterns using resist, alloying, and finally passivation layers and bond pad pattern etching to complete the integrated circuit die.

Figure 19:
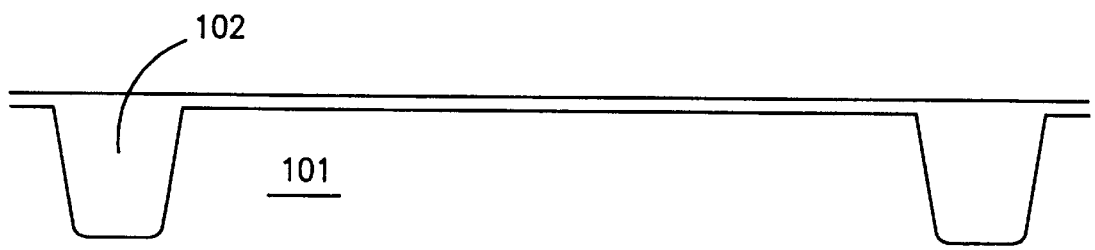
FIGS. 19 through 24 illustrate the steps for constructing a memory cell in accordance with a second fabrication embodiment of the invention.
Figure 20:
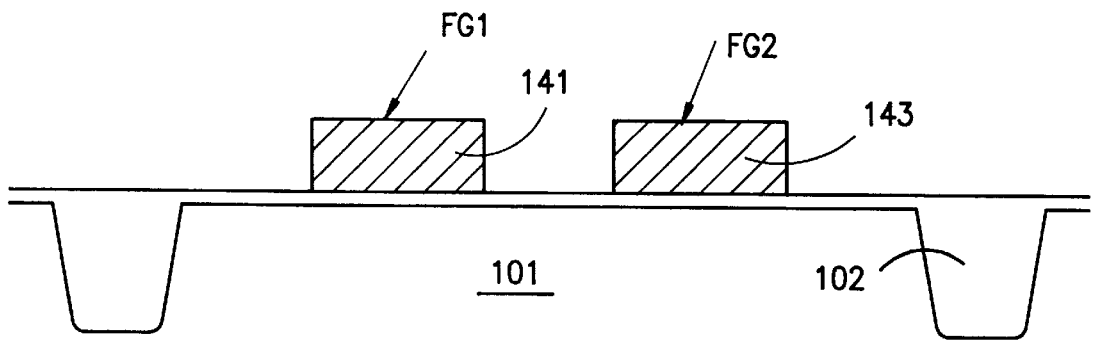
Figure 21:
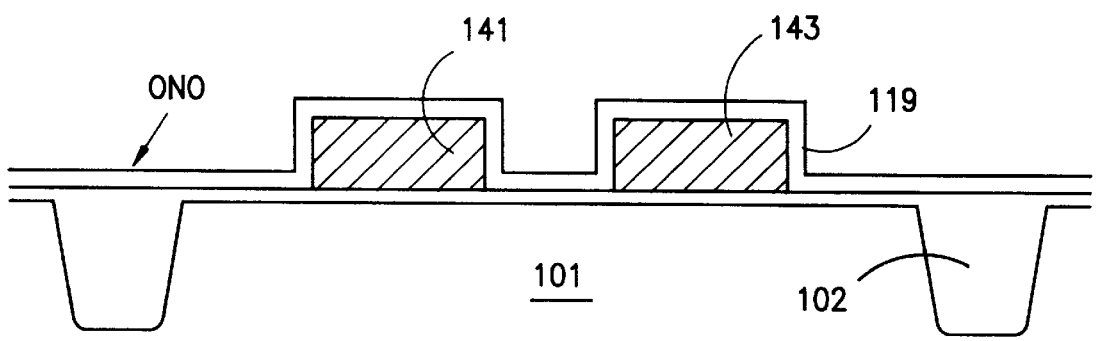
Figure 22:
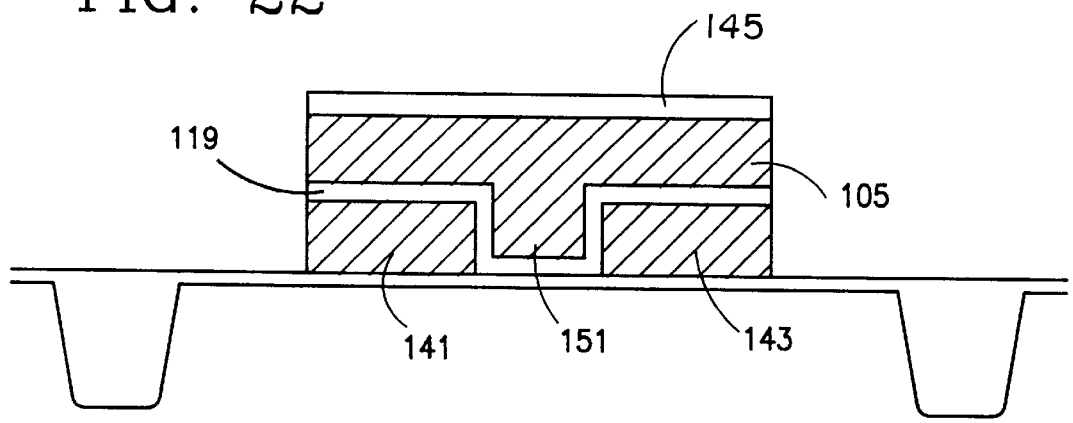

An alternate method for forming transistor 1 with the two floating gates is illustrated in FIGS. 19–24. FIG. 19 illustrates the P-type substrate 101 having the field oxide 102 deposited therein for isolating active area 17 (FIG. 3). Subsequently, a pair of spaced apart doped polysilicon channels 141 and 143 are deposited on the oxide layer 102. These channels will form the floating gate regions 3 and 5. An ONO insulating layer 119 is then formed over the entire substrate surface as illustrated in FIG. 21. The ONO layer is selectively removed from the substrate except for the areas over and between the floating gate regions 141 and 143. A doped polysilicon word line 105 is then formed over the floating gate regions 141 and 143. The word line 105 includes an area 151 which extends down and into the space separating the two polysilicon floating gate regions 141 and 143. A polysilicide layer 145 is also provided on top of the word line polysilicon layer 105.

Figure 23:
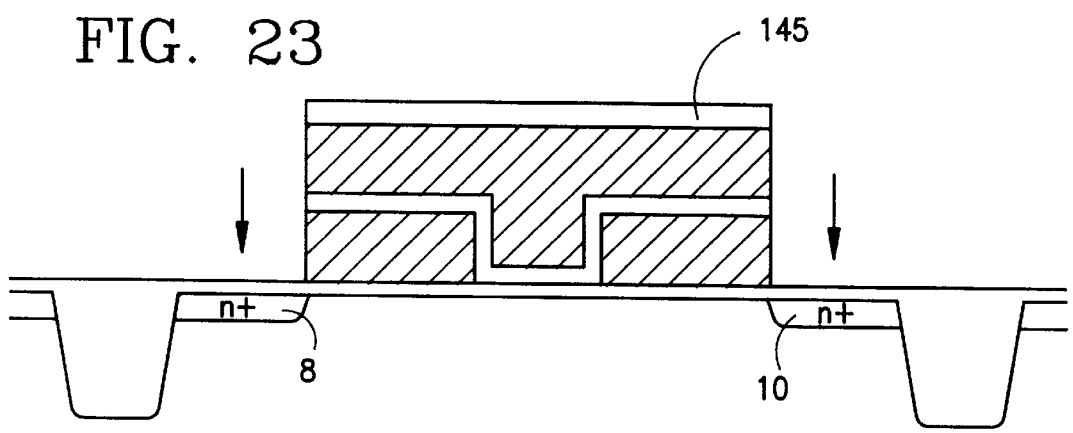
Figure 24:
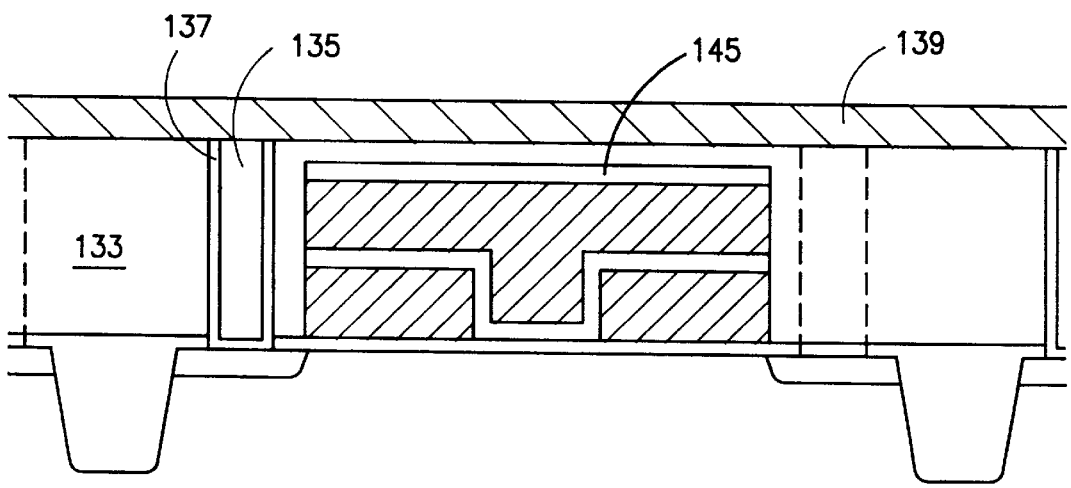

The polysilicide layer 145 is used as the mask for diffusion of the N+ source and drain regions 8 and 10 in substrate 101, as shown in FIG. 23. A BPSG layer 133 is then applied as in the previous embodiment. The pattern contact layer 139, plug 135, and conductive sidewall 137, as illustrated in FIG. 24, are all formed as described above with respect to FIG. 18.

The subsequent stages of processing the integrated circuit to form the interconnects, bonding pads etc., are as described above with respect to the first fabrication embodiment.

Figure 27:
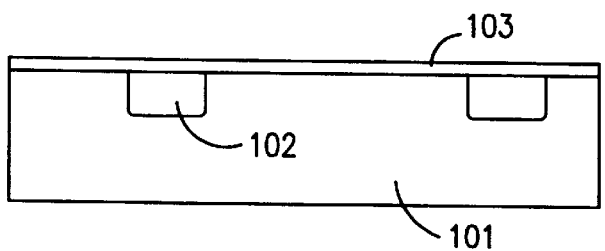
FIGS. 27–43 illustrate the steps for constructing a memory cell in accordance with a third fabrication embodiment of the invention.

FIGS. 27 through 43 illustrate yet another method for forming transistor 1 with active regions which are effectively raised relative to the floating gates. Referring first to FIG. 27, P-type silicon substrate 101 is illustrated having shallow field oxide isolation regions 102 formed therein as in prior embodiments. In addition, a gate oxide layer 103 is deposited over the entire surface of the substrate 101. This oxide layer 103 may be dispensed with if an oxide layer is deposited over the entire substrate 101 as part of the processing to produce the field oxide regions 102.

Figure 28:
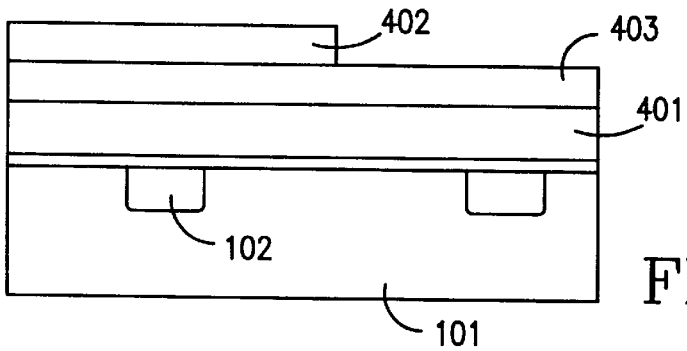

As illustrated in FIG. 28, a doped polysilicon layer 401 is then deposited on top of the gate oxide layer 103. The polysilicon may be doped as it is being deposited or maybe doped after polysilicon deposition. Following placement of the doped polysilicon layer 401 over substrate 101 an insulating layer such as a nitride layer or oxide layer 403 is then applied over the substrate 101.

Figure 29:
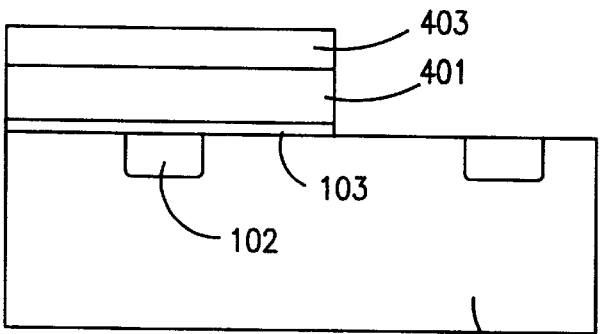
Figure 30:
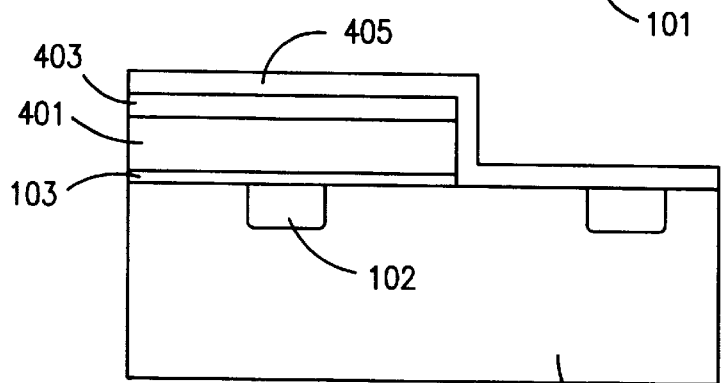
Figure 31:
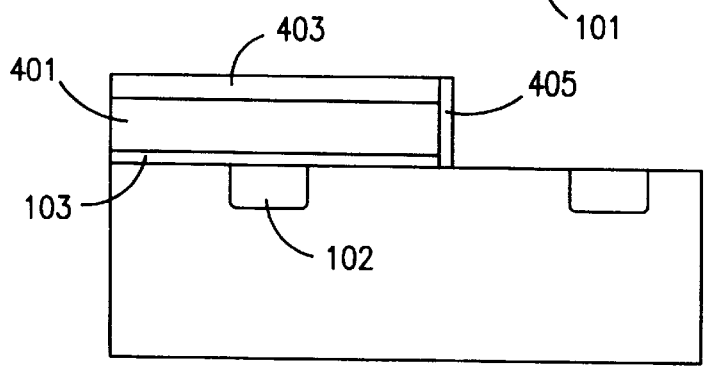

Subsequently, a resist layer 402 is formed in a pattern which is used as a mask for a subsequent wet etch of layers 403 and 401 as well as oxide layer 103. The etching result is illustrated in FIG. 29, which also shows subsequent removal of the resist layer 402. The next step of the process is illustrated in FIG. 30 wherein an oxide layer 405 is deposited on the entire surface of the substrate. Following this, the deposited oxide layer is etched using an RIE dry etched process so that oxide layer 405 only remains as a vertical wall, as shown in FIG. 31. This will ultimately form a spacer region between the two floating gates of transistor 1.

Figure 32:
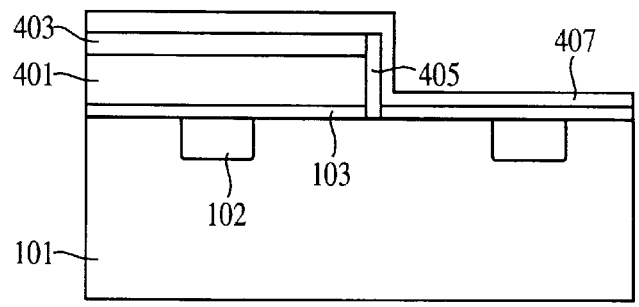
Figure 33:
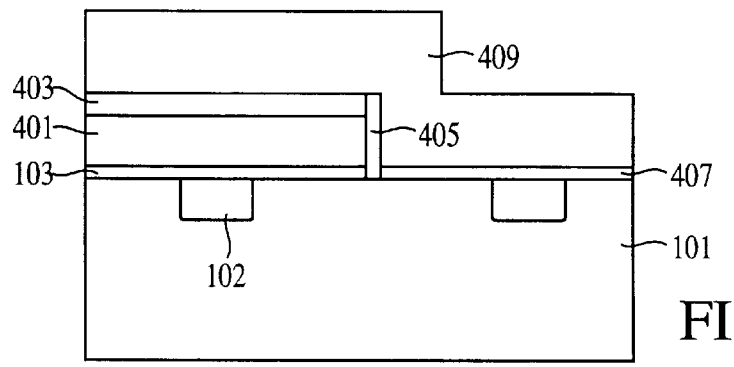

FIG. 32 illustrates the deposition of an oxide layer 407 over the entire surface of the substrate 101 which is also selectively etched so that the deposited oxide layer 407 only remains directly on the surface of substrate 101. Following this, another doped polysilicon layer 409 is applied over the entire surface of the substrate as illustrated in FIG. 33. Once again, the polysilicon may be doped as it is being deposited or after an undoped polysilicon layer is deposited.

Figure 34:
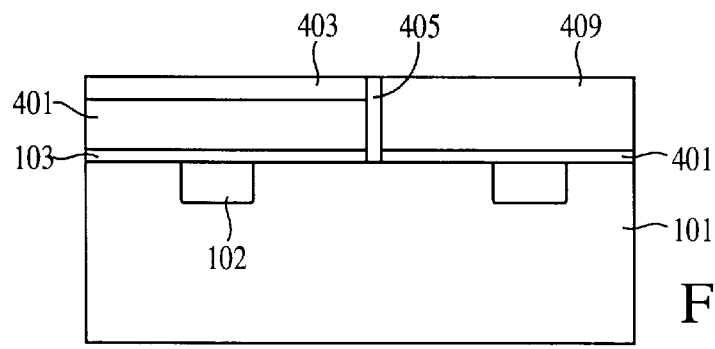
Figure 35:
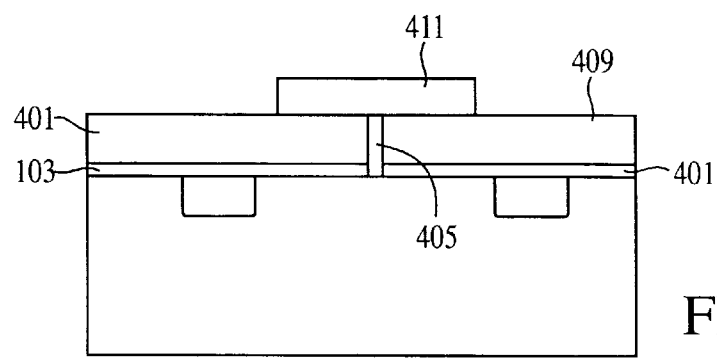

FIG. 34 illustrates a planarization of the top surface of the substrate by conventional CMP (chemical/mechanical/planarization process) following which an oxide etched dip is used to remove the remaining oxide layer 403. Subsequently, patterned resist layer 411 is applied to the surfaces of the polysilicon layers 401 and 409 as shown in FIG. 35. This layer will act as a mask for etching the two polysilicon floating gates of the transistor 1.

Figure 36:
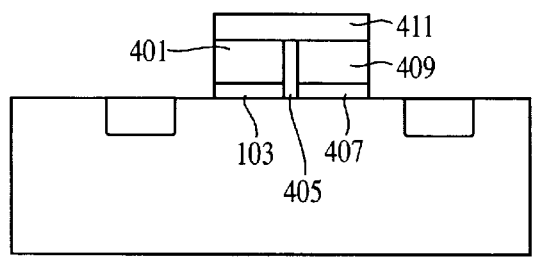
Figure 37:
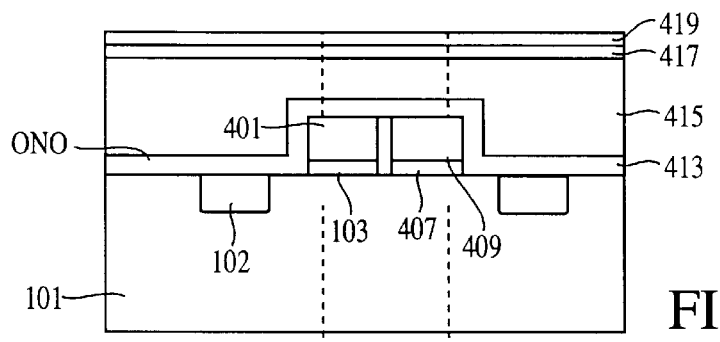
Figure 38:
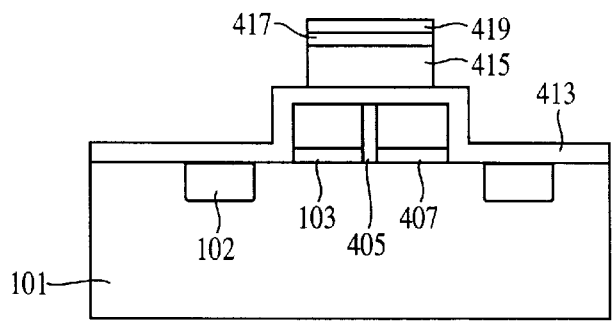

FIG. 36 illustrates the results of etching the polysilicon layers 401 and 409 using the resist layer 411 as a mask. The layer 411 is then removed from FIG. 36. Following this, an ONO (oxide, nitride, oxide) layer 413 is created by, for example, a nitride deposition and a wet oxidation step. Then, a doped polysilicon layer 415 is deposited over the ONO layer 413, an oxide dip is performed to create a bonding layer 417 upon which a silicide ($Wsi_x$) layer 419 is deposited, all is illustrated in FIG. 37. A word line etch is then performed using a pattern photoresist placed on layer 419 to yield the structure shown in FIG. 38 with the word line being formed by the silicide layer 419, the oxide bonding layer 417 and the doped polysilicon layer 415. As shown in FIG. 38, the word line is applied so that it extends over both polysilicon regions 401 and 409. As also shown in FIG. 38, after the word line etch, the ONO layer 413 remains substantially intact.

Figure 39:
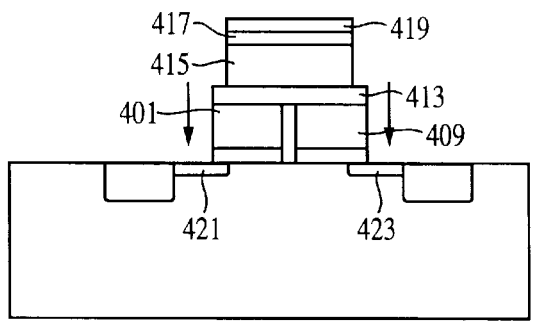

FIG. 39 illustrates the removal of the ONO layer using a wet phosphoric acid dip. The ONO layer 413 is removed from both the surface of the substrate as well as the sidewalls on either side of the polysilicon areas 401 and 409. Subsequently, N+ source and drain regions 421 and 423 are doped into substrate 101.

After the source and drain regions 421 and 423 are created the sidewalls of the polysilicon layers, 401 409, and 415 are oxidized. This can be accomplished by oxidizing the polysilicon areas themselves, by depositing an oxide, or by a combination of the two techniques.

Figure 40:
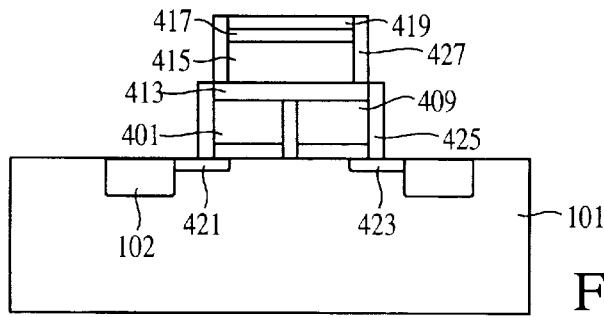

Also, the ONO layer 413 could also be etched in a manner which keeps it on the sidewalls of the polysilicon areas 401 and 409 when ONO layer 413 is otherwise removed. FIG. 40 shows an arrangement where oxide sidewalls 425 and 427, however created, exist on sides of the polysilicon areas 401, 409, and 415.

Figure 41:
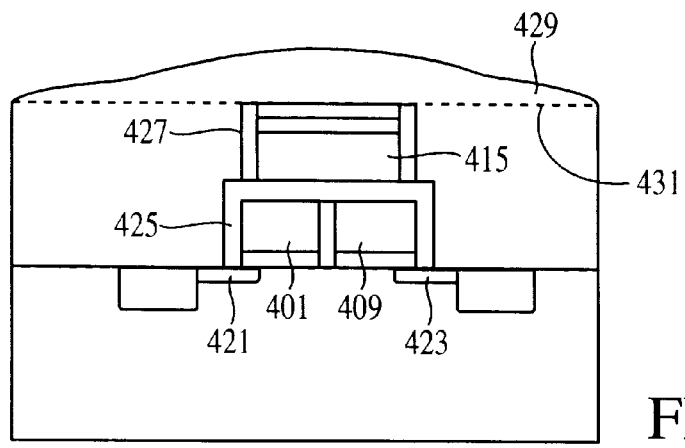
Figure 42:
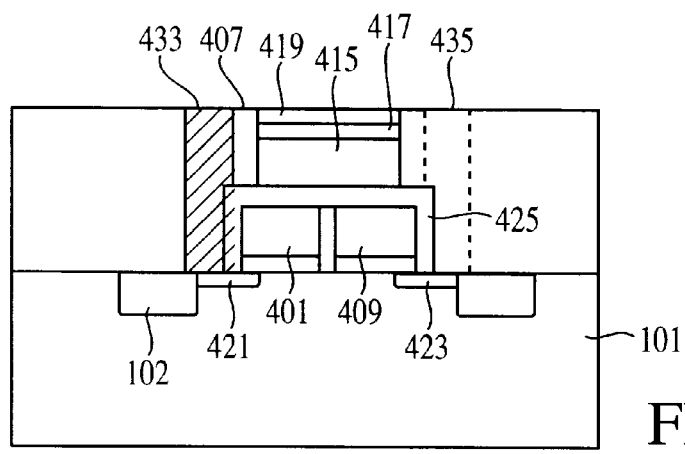

Subsequently, a TEOS oxide deposition is conducted and the deposited TEOS layer 429 is planarized to the dotted line 431 in FIG. 41. The planarized surface is then selectively etched to produce holes for plugged areas 433 and 435 to allow contact with oxide sidewall 425 without etching oxide sidewall 425. To ensure that plugged areas 433 and 435 will contact the sidewall 425, the holes also partially extend over the top surface of the oxide which forms sidewall 425, as shown in FIG. 42. Area 433 is shown as being an area directly in the sectional view illustrated in FIG. 42, while 435 represents a plug area for the region 423 which is located deeper into the FIG. 42 view. After etching of the areas 433 and 435, they are then filled with a doped polysilicon to form polysilicon plugs which connect with the source and drain regions 421 and 423 respectively. As noted, the polysilicon plugs partially overlap the top ledge of oxide sidewall 425.

Figure 43:
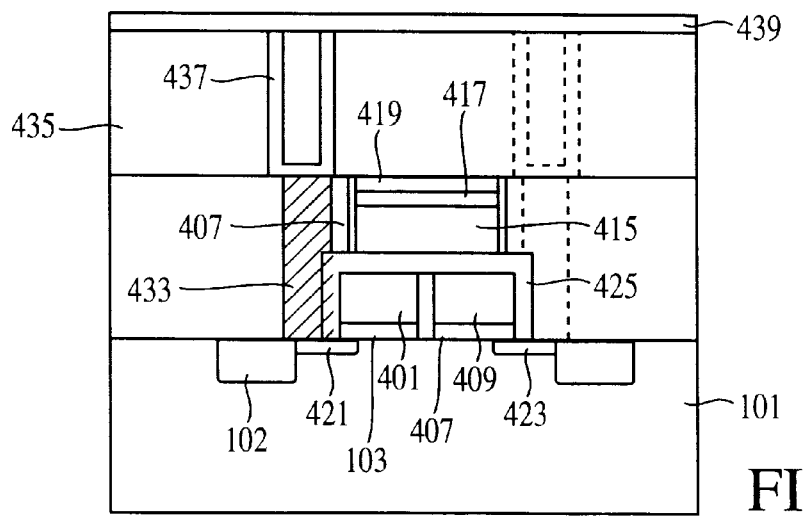

After regions 433 and 435 have been filed with doped polysilicon another CMP planarization process is conducted to level the substrate surface following which a BPSG layer 435 is deposited, reflowed, and activated through a conventional high temperature process. This BPSG layer is then once again, planarized using a CMP process and a contact pattern is then etched in the BPSG layer for connection with the respective polysilicon plugs in regions 433 and 435. The contact holes 437 which are etched in the BPSG layer 435 are then filled with conventional plug material (e.g. Ti/TiN/W) and once again the top surface of the BPSG layer 435 is then CMP planarized. Following this, a metal layer 439 is applied, patterned, all is shown in FIG. 43. Subsequently, additional metal layers are applied for forming the conductors which connect with the silicide gate layer 419 and each of the polysilicon regions 433 and 435.

Figures 44, 45:
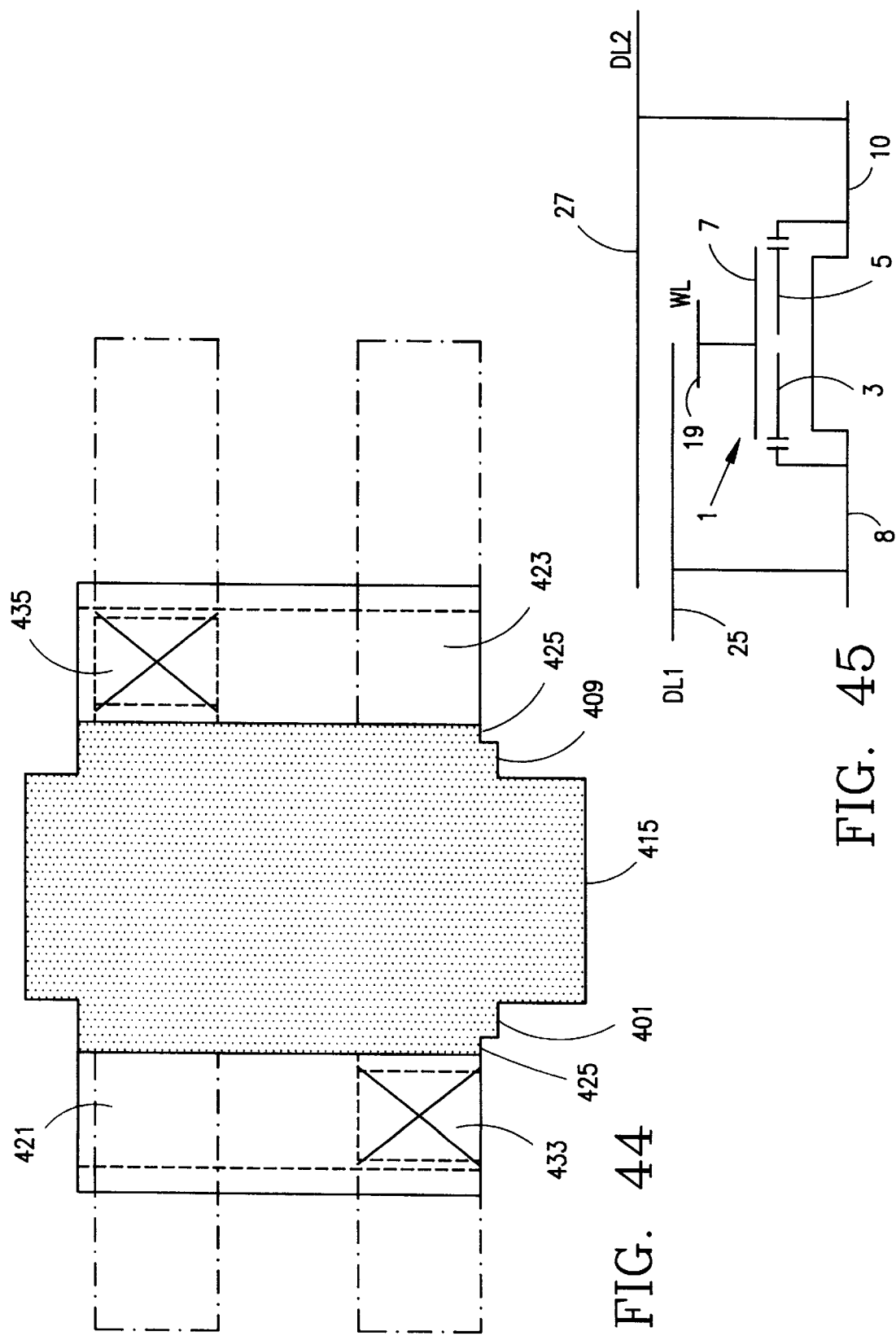
FIG. 44 is a top of a portion of the memory cell fabricated by the third fabrication.
FIG. 45 illustrates the electrical schematic of a memory cell constructed in accordance with the invention.

FIG. 44 illustrates a top view of the structure illustrated in FIG. 43 with some structures removed to show the relationship of the sidewall oxide layer 425 to the floating gates 401, 409 and to the active regions 433 and 435. FIG. 45 is an electrical schematic of the memory cell of the third fabrication embodiment showing the additional electrical connection between the floating gate regions 3,5 and respective source and drain regions 8, 10 through capacitors (formed by respective sidewall insulators 425).

An important aspect of the FIGS. 43, 44, 45 structure is that the conductive polysilicon plugs 433, 435 are not only in contact with the respective regions 421, 423 which form the active source/drain regions of transistor 1, but they are also in contact with the insulator oxide layer 425 on respective sides of the doped polysilicon regions 401 and 409. Since regions 401 and 409 form the floating gates for the transistor 1, this means that the floating gate areas 401 and 409 are electrically isolated from the active source/drain regions 421, 423 by the underlying gate oxide layers 103, 407 and by the sidewall oxide layer 425 since the conductive plugs 433 and 435 are in contact with sidewall oxide layer 425. As a consequence, charge storage in the transistor 1 occurs across these oxide regions which act as the dielectrics of a capacitor formed by the active regions 421, 423, and the floating gates 401, 409.

Stated otherwise, the structure illustrated in FIG. 43 effectively has a raised active (source/drain) region on either side of the floating gates which produces an increased capacitance between each of the floating gate regions and a respective adjacent active region. This enables a charge to be more easily stored in and also erased from the floating gate regions during operation of transistor 1. In particular, the erase function is enhanced as the erase action will occur laterally in the sidewall of the floating gate. This also enables the transistor length to be shortened. An additional benefit of the FIG. 43 structure is that each of the floating gates is thicker which also enhances the speed of the erase time due to the increased capacitor coupling. The write programming is also improved somewhat since it occurs on the sidewalls as well as from below the floating gates. Although, Charging Hot Electron (CHE) programming occurs mainly at the drain edge below the floating gates, while some tunneling programming also occurs along with the sidewall.

Although in FIG. 43 a raised active region, that is, structure is illustrated in a transistor having two spaced floating gates 401 and 409, it also has applicability to a single floating gate transistor as well. In such an environment there need be only one raised source/drain region on one side of the single floating gage formed by a conductive plug, such as 435, in contact with a sidewall oxide in the same manner as illustrated for either floating gate region 401 or 409 of FIG. 43. For convenience, when fabricating a single floating gate transistor the raised active region can be formed on both sides of the floating gate.

In addition, it is also possible to apply the effective raised active region to only one of the two floating gates in FIGS. 43, 44 structure. The read, write and erase operations for the FIGS. 43, 44 structure is an described above with respect to FIGS. 1–6.

Figure 25:
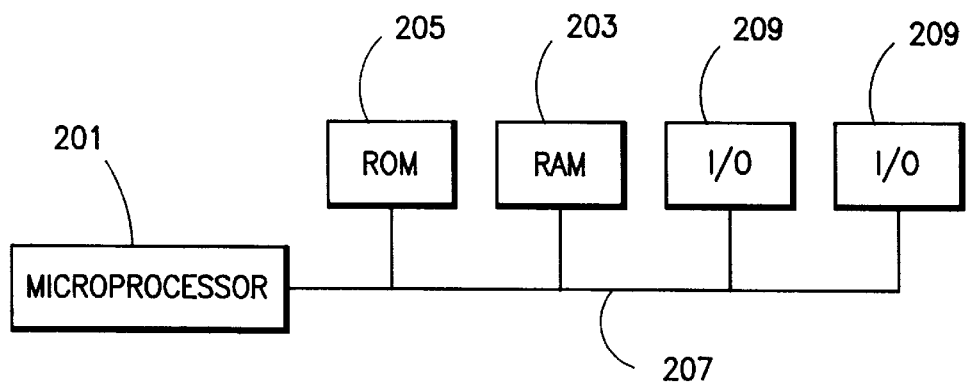
FIG. 25 illustrates use of the invention in a computer system.

FIG. 25 illustrates use of a flash memory containing the invention as the read only memory device 205 in a computer system which includes a microprocessor 201, a RAM memory 203, bus structure 207 and several input/output devices 209.

Figure 26:
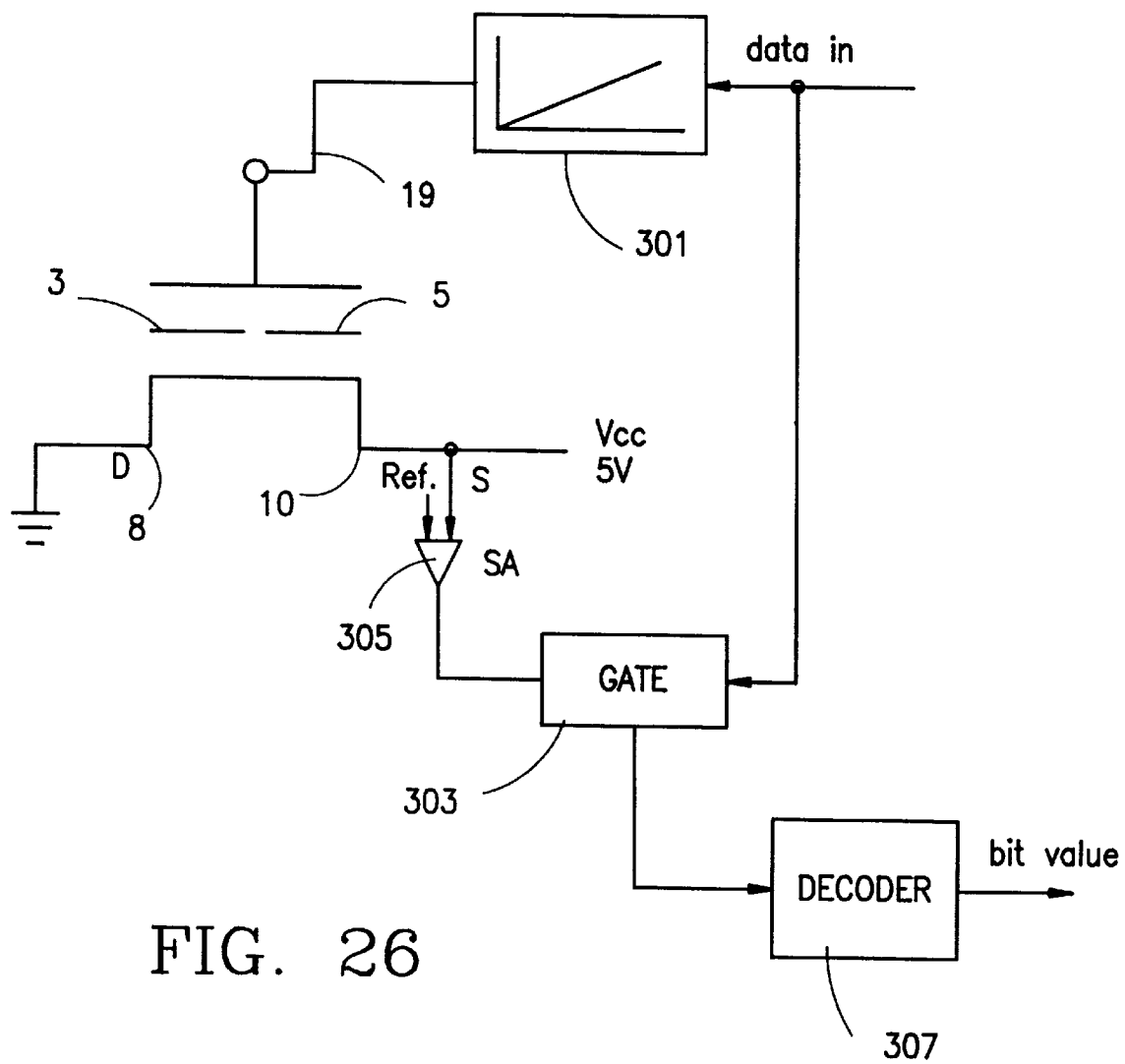
FIG. 26 illustrates another technique for activating the digit lines and row line to read a stored multi-bit binary value from the memory cell.

Although the multi-bit decoding of each cell transistor 1 is accomplished by separately reading the charges from each floating gate by the current flow from one transistor region to another and the subsequent decoding the two read out values, it is also possible to determine the threshold voltage Vt, which is set by the combination of charges on the two floating gates, directly. This is illustrated in FIG. 26. The source 10 of a selected transistor 1 is connected to a first voltage e.g. approximately 5 V, and the drain to a second voltage, e.g. ground, and a digitally controlled ramp voltage from generator 301 is connected to word line 19 (control gate) for the transistor. As the gate ramp voltage increases based on the digital value input to generator 301 the transistor 1 will turn on at a ramp voltage level corresponding to the threshold voltage Vt of the cell, which in turn is determined by the charges stored on the floating gates. The ramp voltage at the time the transistor turns on by the digital input to generator 301 corresponds to Vt. Accordingly, when the transistor 1 turns on an associated sense amplifier 305 operates a gate 303 to pass the digital input to generator 301, representing the ramp output voltage, to decoder 307 which decodes the digital data to produce a multi-bit pattern e.g. 00, 01, 10, 11 representing the data stored in the cell.

In addition, although each of the floating gate regions 3,5 stores a charge which varies between two levels, it is also possible to store multiple levels of charge, e.g. 3 or more levels in each floating gate, which are read out, with the multi-level charges from each of the two floating gates being fed into a decoder for determining a multi-bit binary value stored in each transistor 1. If three levels of charge are stored for each floating gate, a total of 9 possible combinations of charge could be stored in each memory cell enabling storage of a 3 bit binary value in each cell. Storing 4 levels of charge in each floating gate would enable each cell to store a 4-bit binary value.

Although the invention has been described with reference to particular embodiments thereof, it should be appreciated that many changes and modification can be made without departing from the spirit or scope of the invention. Accordingly, the invention is not to be considered as limited by the foregoing description, but is only limited by the scope of the appended claims.

What is claimed is:

1. A memory cell comprising:
   a word line;
   first and second digit lines;
   a transistor comprising a control gate region connected to said word line, active doped regions respectively connected to said first and second digit lines, and at least first and second floating gate regions located beneath said control gate region;
   at least one of said floating gate regions being capacitively coupled to a respective active doped region through a dielectric region located below said at least one floating gate region and through a dielectric region located on a sidewall of said at least one floating gate region; and
   an electrically conductive material extending from at least a first one of said active doped regions to a position adjacent to said at least one floating gate region such that said electrically conductive material is coupled to said dielectric region located on a sidewall of said at least one floating gate region.

2. A memory cell as in claim 1 wherein said memory cell is formed in an integrated circuit and said at least first and second floating gate regions are located adjacent each other and separated by an insulator.

3. A memory cell as in claim 1 wherein each of said floating gate regions is arranged to store respective charges enabling said memory cell to store a multi-bit digital value.

4. A memory cell as in claim 3 wherein said multi-bit digital value represents two bits of digital information.

5. A memory cell as in claim 3 wherein said multi-bit digital value represents more than two bits of digital information.

6. A memory cell as in claim 3 further comprising an electronic circuit connected to said word line and first and second digit lines for operating said transistor to write and read said multi-bit digit value to and from said memory cell.

7. A memory cell as in claim 6 wherein said transistor stores at least two separate binary digit values by the charges stored in said first and second floating gate regions.

8. A memory cell as in claim 6 wherein said electronic circuit applies a first voltage to said word line and, for at least a portion of the duration of the application of said first voltage to said word line, a second voltage to a digit line connected with one of said first and second floating gate regions to store a charge in said one floating gate region.

9. A memory cell as in claim 8 wherein said electronic circuit further applies a third voltage to a digit line associated with the other of said first and second floating gate regions for at least a portion of the duration of the application of said first voltage to store a charge in said other floating gate region.

10. A memory cell as in claim 4 wherein a gate region threshold voltage Vt of said transistor is related to the value of the charges stored in said first and second floating gate regions.

11. A memory cell as in claim 9 wherein said electronic circuit applies said second and third voltages in sequence for at least a portion of the duration that said electronic circuit applies said first voltage to said word line.

12. A memory cell as in claim 6 wherein said electronic circuit applies a fourth voltage to said word line, and for at least a portion of the duration of the application of said fourth voltage to said word line, a fifth voltage to a digit line associated with one of said first and second floating gate regions to read a bit value defining charge stored in said one floating gate region.

13. A memory cell as in claim 12 wherein said electronic circuit applies a sixth voltage to a digit line associated with the other of said first and second floating gate regions for at least a portion of the duration of the application of said fourth voltage to said word line to read a bit value defining charge stored in said other floating gate region.

14. A memory cell as in claim 13 wherein said electronic circuit applies said fifth and sixth voltages in sequence for at least a portion of the duration that said electronic circuit applies said fourth voltage to said word line.

15. A memory cell as in claim 1 wherein said memory cell is part of a flash memory array.

16. A memory cell as in claim 13 further comprising a decoder responsive to the charges read from said first and second floating gate regions for providing a multi-bit binary value representing the charges stored in said first and second floating gate regions.

17. A memory cell as shown in claim 6, wherein a gate region turn on threshold voltage Vt of said transistor is related to the value of the charges stored in said first and second floating gates and wherein said electronic circuit supplies voltage to said row and first and second digit lines in a manner which enables said threshold voltage Vt to be determined.

18. A memory cell as in claim 17, further comprising a decoder for providing a multi-bit value in response to a determined threshold voltage Vt.

19. A memory cell as in claim 17, wherein said electronic circuit supplies a ramp voltage to said word line while biasing said source and drain regions through said digit lines in a manner which causes said transistor to turn on when said ramp voltage reaches said gate region threshold voltage Vt, a representation of said ramp voltage at the time of turn on of said transistor being decoded to thereby read a multi-bit digit value from said memory cell.

20. A memory cell as in claim 1, wherein each of said floating gate regions is capacitively coupled to a respective active doped region through a dielectric region located below it and through a dielectric region located on one of its sidewalls.

21. A memory cell as in claim 1, wherein said sidewall dielectric region connects with a conductive area, said conductive area providing a conductive path connecting an active doped region associated with said at least one floating gate region with an associated digit line.

22. A memory cell as in claim 21, wherein said conductive area is a conductive plug.

23. A memory cell as in claim 21, wherein said sidewall dielectric region runs the length of said at least one floating gate region and said conductive area connects with a portion of said sidewall dielectric region.

24. A memory cell as in claim 1, wherein said sidewall dielectric region is formed of an oxide layer.

25. A memory cell as in claim 1, wherein said sidewall dielectric region is formed of an ONO layer.

26. A memory cell comprising:
a word line;
first and second digit lines;
a transistor comprising a control gate region connected to said word line, active doped regions respectively connected to said first and second digit lines, and a floating gate region located beneath said control gate region, said floating gate region being capacitively coupled to one of said actively doped regions through a dielectric region located below said floating gate region and through a sidewall dielectric region; and
an electrically conductive material extending from said actively doped region with which the floating gate region is capacitively coupled to a position adjacent to said floating gate region such that said electrically conductive material is coupled to said sidewall dielectric region.

27. A memory cell as in claim 26, wherein said sidewall dielectric region connects with a conductive area, said conductive area providing a conductive path connecting an active doped region associated with said at least one floating gate region with an associated digit line.

28. A memory cell as in claim 27, wherein said conductive area is a conductive plug.

29. A memory cell as in claim 26, wherein said sidewall dielectric region runs the length of said at least one floating gate region and said conductive area connects with a portion of said sidewall dielectric region.

30. A memory cell as in claim 26, wherein said sidewall dielectric region is formed of an oxide layer.

31. A memory cell as in claim 26, wherein said sidewall dielectric region is formed of an ONO layer.

32. A computer system comprising:
a processor and a flash memory connected to said processor for storing information used by said processor, said flash memory comprising a plurality of arrayed memory cells, at least some of said arrayed memory cells comprising:
a word line;
first and second digit lines;
a transistor comprising a control gate region connected to said word line, active doped regions respectively connected to said first and second digit lines, and at least first and second floating gate regions located beneath said control gate region;
at least one of said floating gate regions being capacitively coupled to a respective active doped region through a dielectric region located below said at least one floating gate region and through a dielectric region located on a sidewall of said at least one floating gate region; and
an electrically conductive material extending from said respective active doped region to a position adjacent to said at least one floating gate region such that said electrically conductive material is coupled to said dielectric region located on a sidewall of said at least one floating gate region.

33. A computer system as in claim 32, wherein said transistor is formed in an integrated circuit and said at least first and second floating gate regions are located adjacent each other separated by an insulator.

34. A computer system as in claim 32, wherein each of said floating gate regions is arranged to store a separate charge enabling said transistor to store a multi-bit digital value.

35. A computer system as in claim 34, wherein said multi-bit digital value represents two bits of digital information.

36. A computer system as in claim 34, wherein said multi-bit digital value represents more than two bits of digital information.

37. A computer system as in claim 34, further comprising an electronic circuit connected to said word line and first and second digit lines for operating said transistor to write and read said multi-bit digit value to and from said memory cell.

38. A computer system as in claim 34, wherein said electronic circuit applies a first voltage to said word line and, for at least a portion of the duration of the application of said first voltage to said word line, a second voltage to a digit line connected with one of said first and second floating gate regions to store a bit value defining charge in said one floating gate region.

39. A computer system as in claim 38, wherein said electronic circuit further applies a third voltage to a digit line associated with the other of said first and second floating gates for at least a portion of the duration of the application of said first voltage to said word line to store a bit value defining charge in said other floating gate region.

40. A computer system as in claim 34, wherein a gate region threshold voltage Vt of said transistor is related to the value of the charges stored in said first and second floating gate regions.

41. A computer system as in claim 39, wherein said electronic circuit applies said second and third voltages in sequence for at least a portion of the duration that said first electronic circuit applies said first voltage to said word line.

42. A computer system as in claim 34, wherein said electronic circuit applies a fourth voltage to said word line and for at least a portion of the duration of the application of said fourth voltage to said word line, a fifth voltage to a digit line associated with one of said first and second floating gate regions to read a bit value defining charge stored in said one floating gate region.

43. A computer system as in claim 42, wherein said electronic circuit applies a sixth voltage to a digit line associated with the other of said first and second floating gate regions for at least a portion of the duration of the application of said fourth voltage to said word line to read a bit value defining charge stored in said other floating gate.

44. A computer system as in claim 34, wherein said electronic circuit applies said fifth and sixth voltages for at least a portion of the duration that said electronic circuit applies said fourth voltage to said word line.

45. A computer system as in claim 32, wherein said memory cell is part of a flash memory array.

46. A computer system as in claim 43, further comprising a decoder responsive to the charges read from said first and second floating gate regions for providing a multi-bit binary value representing the charges stored in said first and second floating gate regions.

47. A computer system as in claim 37, wherein a gate region turn on threshold voltage Vt of said transistor is related to the value of the charges stored in said first and second floating gates and wherein said electronic circuit supplies voltage to said row and first and second digit lines in a manner which enables said threshold voltage Vt to be determined.

48. A computer system as in claim 47, further comprising a decoder for providing a multi-bit value in response to a determined threshold voltage Vt.

49. A computer system as in claim 47, wherein said electronic circuit supplies a ramp voltage to said word line while biasing said source and drain regions through said digit lines in a manner which causes said transistor to turn on when said ramp voltage reaches said gate threshold voltage Vt, a representation of said ramp voltage at the time of turn on of said transistors being decoded to thereby read a multi-bit digit value from said memory cell.

50. The memory cell of claim 1, wherein said electrically conductive material comprises at least one conductive plug.

51. The memory cell of claim 26, wherein said electrically conductive material comprises at least one conductive plug.

52. The system of claim 32, wherein said electrically conductive material comprises at least one conductive plug.

* * * * *

UNITED STATES PATENT AND TRADEMARK OFFICE
CERTIFICATE OF CORRECTION

PATENT NO.    : 6,178,113 B1
DATED         : January 23, 2001
INVENTOR(S)   : Fernando Gonzalez et al.

It is certified that error appears in the above-identified patent and that said Letters Patent is hereby corrected as shown below:

<u>Column 12, claim 10,</u>
Line 1, the number "4" should be replaced with the number -- 3 -- .

Signed and Sealed this

Twentieth Day of November, 2001

Attest:

*Nicholas P. Godici*

NICHOLAS P. GODICI
*Acting Director of the United States Patent and Trademark Office*

*Attesting Officer*